United States Patent [19]
Chadi et al.

[11] Patent Number: 5,920,409
[45] Date of Patent: Jul. 6, 1999

[54] OPTOELECTRONIC DEVICES USING PERSISTENT PHOTOCONDUCTIVITY

[75] Inventors: James D. Chadi, Princeton; George E. Devlin, Warren; Richard A. Linke, Princeton; Robert L. MacDonald, Princeton; Tineke Thio, Princeton, all of N.J.

[73] Assignee: NEC Research Institute, Inc., Princeton, N.J.

[21] Appl. No.: 08/820,491

[22] Filed: May 31, 1996

Related U.S. Application Data

[63] Continuation of application No. 08/225,047, Apr. 8, 1994, abandoned.

[51] Int. Cl.[6] .............................. G03H 1/02; G03H 1/08; G02B 5/32; H01L 27/14
[52] U.S. Cl. ................................ 359/15; 359/3; 359/6; 359/9; 257/431; 257/432
[58] Field of Search ...................... 359/1, 3, 6, 7, 359/15, 19, 9; 368/234, 235; 257/84, 441, 431, 432; 250/370.08

[56] References Cited

U.S. PATENT DOCUMENTS

| | | | |
|---|---|---|---|
| 4,838,630 | 6/1989 | Jannson et al. ............................. | 359/3 |
| 4,927,220 | 5/1990 | Hesselink et al. ......................... | 359/7 |
| 4,948,212 | 8/1990 | Cheng et al. .............................. | 359/7 |
| 5,072,122 | 12/1991 | Jiang et al. ........................ | 250/370.08 |
| 5,237,434 | 8/1993 | Feldman et al. .......................... | 359/19 |
| 5,305,123 | 4/1994 | Sadornik et al. ........................... | 359/4 |

OTHER PUBLICATIONS

Raymond K. Kostuk et al, "Design considerations for holographic optical interconnects", Applied Optics, vol. 26, No. 18, Sep. 15, 1987, pp. 3947–3953.

L.H. Lin et al, "Efficient and Aberration–Free Wavefront Reconstruction from Holograms illuminated at Wavelengths Differing from the Forming Wavelength", Applied Optics, vol. 10, No. 6, Jun. 1971, pp. 1314–1318.

K. Tsubaki et al, "Spatially modulated photoconductivity at N AlGaAs/GaAs heterojunctions and formation of persistent charge patterns with submicron dimensions", Applied Phys. Lett. 45, 663 (1984) pp. 663–665.

David Brady, "Control of volume holograms" J Opt Soc Am A vol. 9, No. 7, Jul. 1992, pp. 1167–1182.

Fai H. Mok, "Angle multiplexed storage of 5000 holograms in lithium niobate," Optics Letters, vol. 18, No. 11, Jun. 1, 1993, pp. 915–917.

K. Khachaturyan et al, "Lattice relaxation of DX like donors in $Zn_xCd_{1-x}Te$", Physical Review B, vol. 40 No. 9, Sep. 15, 1989, pp. 6304–6310.

*Primary Examiner*—Cassandra Spyrou
*Assistant Examiner*—Audrey Chang
*Attorney, Agent, or Firm*—Jeffery J. Brosemer; Andrew G. Isztwan

[57] ABSTRACT

A compound semiconductor that is suitably doped to exhibit the DX effect is irradiated with an optical beam of spatially varying intensity whereby localized regions of persistently higher conductivity and lower refractive index are created in the semiconductor where sufficient intensity of the beam was incident. The persistently higher conductive region can be used to bridge selected gaps in conductive paths on a support member use in memory device and the regions of lower refractive index can be used to providing guiding in a wave guide, to form high resolution gratings, or to form holograms.

16 Claims, 3 Drawing Sheets

OPTOELECTRONIC DEVICES USING PERSISTENT PHOTOCONDUCTIVITY

CROSS-REFERENCE TO RELATED APPLICATION

This application is a file wrapper continuation of application Ser. No. 08/225,047, filed Apr. 8, 1994, now abandoned.

FIELD OF INVENTION

This invention relates to optoelectronic apparatus and more particularly to such apparatus of the kind that utilizes a doped compound semiconductive element in which there is stored a localized information pattern in the form of regions either of difference in conductivity or of difference in refractive index and such pattern is thereafter used to affect information signals in a useful fashion.

BACKGROUND OF INVENTION

In modern microelectronic systems, there is a wide variety of possible applications for storage elements in which information can be stored in the form of a pattern of localized regions of varying physical properties. Of particular interest are such elements in which the storage can be done by illuminating the storage element with a pattern of light because of the relative ease of this storage technique. It is also generally desirable that the storage pattern be stable for usefully long periods of time but easily erased for subsequent storage later of new patterns in a non-destructive fashion.

One application that would be particularly useful if irradiation for a short time by a light pattern could be used is to establish a stable, but readily erased, corresponding pattern of localized conductive regions near the surface of a semiconductive element otherwise of relatively high resistivity. Such a pattern could be used to provide between a set of input and a set of output terminals on such surface an interconnection pattern of conductive regions that could be readily modified as needed.

Another example of an application that would be useful if a light pattern could be used to create stable, but easily changed, localized regions of different refractive indices near the surface of or in the bulk of a semiconductive element is a diffraction grating. A light beam either reflected from the surface or transmitted through the bulk could be diffracted by such grating in a selective manner and the diffracted beam utilized appropriately.

In particular, photorefractive materials that exhibit a persistent change in their refractive index on exposure to light are useful as potential media for the storage of both data and interconnection patterns for massively parallel computers. See for example, a paper by D. Brady and D. Psaltis that appeared in the Journal of the Optical Society of America, A9, #7, 1167 (1992). In the materials typically considered for these applications, such as barium titanate and lithium niobate, illumination causes an inhomogeneous distribution of trapped charges. Electrons diffuse out of the illuminated regions and are trapped by defects in the dark regions giving rise to a space charge and electric fields. The internal electric fields resulting from this charge distribution then modulate the refractive index through the electro-optic effect. Although this change is only about $2\times10^{-4}$, demonstrations involving the simultaneous storage of up to 5000 images in one crystal of lithium niobate have been reported. See for example, a paper by F. J. Mok in Optic Letters 18(11) Jun. 1, 1993 p. 915.

Presently there is considerable interest in using zinc-blende semiconductors as photorefractive materials because of ther low cost. The EL2 defect center in semi-insulating GaAs has been shown to be useful as a photorefractive center in the presence of acceptor impurities which result in a distribution of $EL2^+$ and $EL2^\circ$ centers and in the possibility of electron exchange between them. The concentration of EL2 centers that can be practically realized is however limited to about $1.5\times10^{16}$ per $cm^3$. Moreover, EL2 exhibits a light-induced metostability which can interfere with this charge exchange. It also appears that EL2 centers do not lead to persistent photoconductivity.

A recognized problem in the use of some n-type doped crystalline compound semiconductive materials is that they exhibit so-called deep donor DX states or centers. The observed effects, which include severe carrier freezeout even at room temperature, have been explained in terms of a large lattice relaxation model and charge capture by the donor. In particular, it is known that in materials that exhibit these phenomena, the total energy of the donor atoms that have captured an electron and become negatively charged is lowered. In these materials, the DX state becomes the ground state of the system and a reduction of free carrier concentration by orders of magnitude from the impurity doping level is often observed at sufficiently low temperatures. As a result even heavily doped material may be rendered essentially insulating. Moreover, it has been shown that, in such materials, persistent photoconductivity (PPC) can occur when the DX states are ionized by photons of appropriate energy. As used herein, PPC means persistence for a time long enough after the illumination has been removed to be useful in the intended device application. For some device applications, persistence of a few seconds may be sufficient, for others persistence for hours may be needed. Generally, the duration of the persistence is a function of the temperature at which the material exhibiting the PPC is maintained, the colder the temperature the longer the persistence, as will be discussed more fully below. Upon photoexcitation each DX center is converted into a positively charged impurity ion, releasing two electrons into the conduction band. A barrier to recombination is formed by the structural relaxation required to return to the deep DX state. If the ambient temperature is sufficiently low, thermal excitation over the capture barrier occurs at a very slow rate and the free carrier concentration can remain high for long times resulting in PPC. The concentration of DX centers is nearly the same as that of the donor impurities and concentrations of $5\times10^{18}$ per $cm^3$ or higher can be achieved. In the original formulation of this model, it was proposed that a donor atom (D) forms a complex with an unknown lattice defect (X). It has subsequently been shown that the donor atom alone, through a distortion in the crystalline lattice associated with electron capture, is responsible for all of the observed phenomena. Nevertheless the "DX" terminology persists among workers in this field.

Among the most important materials from a device standpoint that exhibit these phenomena are $Al_xGa_{1-x}As$ where x is greater than 0.22 and preferably below 0.40, n-type $GaAs_xP_{1-x}$ alloys, and group-II group-VI semiconductive compounds, such as $Cd_xZn_{1-x}Te$, $Cd_xMn_{1-x}Te$, and those involving selenium and CdS alloys. Moreover, theoretical studies suggest that n-type GaN, AlGaN and SiC, and CuCl should have similar properties, operating at even higher temperatures.

In the past these DX-PPC phenomena have been viewed as a problem to be avoided and little effort appears to have been made to utilize them beneficially for device applications.

SUMMARY OF THE INVENTION

The present invention involves optoelectronic apparatus that makes use of this persistent conductivity effect. In particular, we have found and have utilized the fact that in appropriate media and at appropriate temperatures exposure to spatially varying light intensity can create in the medium localized regions in which electrons, liberated by the illumination, remain even after the illumination is discontinued. A key, and previously unexploited feature is that these electrons, though relatively free to move in the conduction band, appear to be constrained by Coulomb forces to remain near the ions from which they were liberated. These electrons will cause the localized regions in which they are contained to be of higher conductivity and of lower refractive index than intervening regions in the medium not experiencing the same illumination.

This permits creating fine features of localized regions with high conductivity and lower index of refraction because of the high concentration of liberated electrons in an appropriate semiconductor body that is otherwise of high resistivity. If the temperature is maintained sufficiently low that the recapture of the photocarriers into DX states is insignificant, the high conductivity features will persist almost indefinitely, if not disturbed. Such features later can be erased optically, or by sufficient thermal annealing to overcome the recombination barrier, or by applying sufficient electric current to the semiconductor body. Such features can be used to form between selected regions of the body conductive paths that remain stable until erased.

Additionally, the difference in free carrier concentration between exposed and unexposed regions can result in a substantial difference in the refractive index in each of the two types of regions due to the Plasma Effect, as is discussed in the book entitled "Introduction to Solid State Physics," Chapter 8, by C. Kittel, John Wiley and Sons Inc. (1967). Moreover, the index change, $\Delta n$, though small in absolute value, for example potentially equal to about 0.013 in Si-doped $Al_{0.03}Ga_{0.7}As$, is substantially higher than that in conventional photorefractive materials, such as barium titanate, and therefore makes possible high efficiency diffraction gratings in the compound semiconductor exhibiting the PPC effect.

An important advantage of this photorefractive material is that the writing light causes a change in the state of the system, such that once a grating is written, the grating is insignificantly affected by subsequent writing operations. This makes it possible to store a large number of independent gratings in the same semiconductive body. This is in contrast with the photorefractive materials presently available in which subsequent writing operations partially erase previous gratings and so sharply limit the number of independent gratings that can be written in the same element.

Another advantage of this induced photoconductivity is that the rate of the loss of persistence can be controlled by the operating temperature so that self erasure can be achieved after the need for the photoconductivity to persist disappears. This makes possible subsequent rewriting of the material without the need for a specific erasing step.

These various properties make possible a variety of new devices of which some of the more promising will be described below.

The invention will be better understood from the following more detailed description taken with the accompanying drawing.

DETAILED DESCRIPTION OF THE INVENTION

Figure 1:
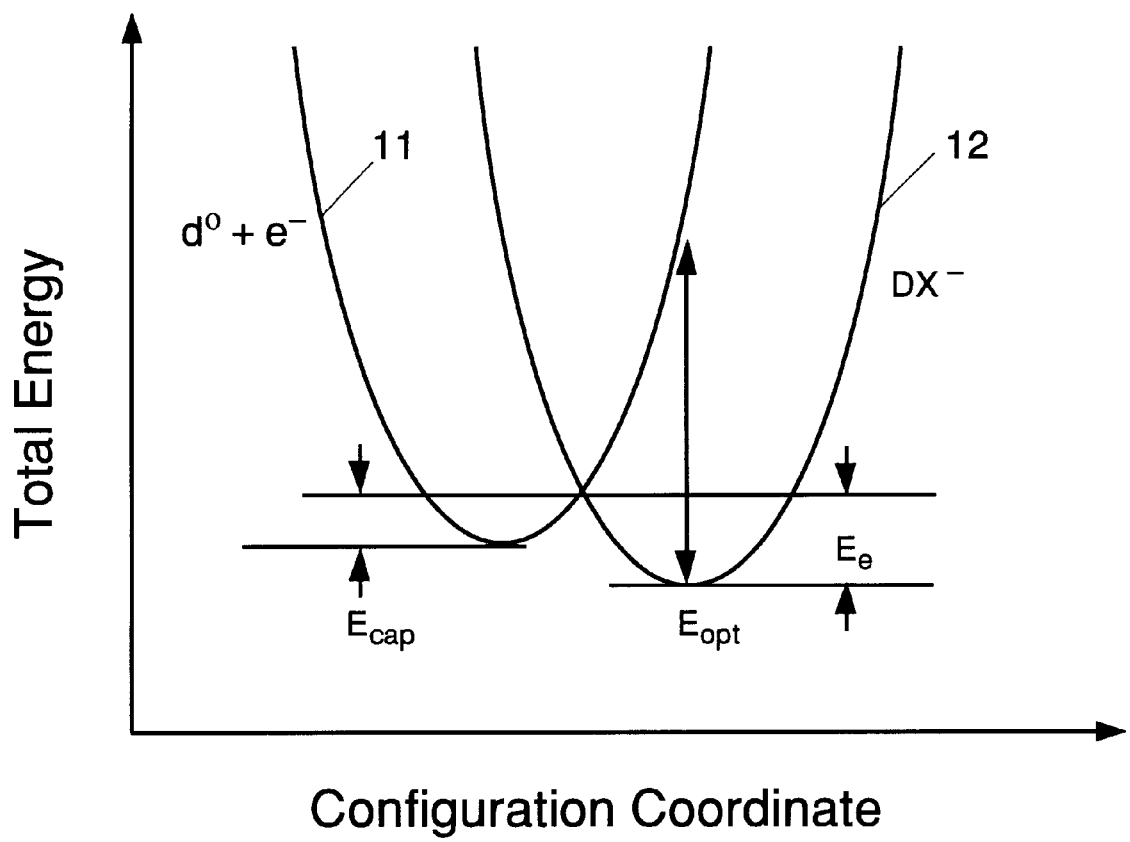
FIG. 1 is an energy diagram that will be useful in explaining the "DX-PPC" phenomenon that is important to the invention.

With reference now to the drawing, FIG. 1. shows a configuration coordinate energy diagram for $Al_xGa_1$-xAs, doped with a silicon or selenium donor, where x is greater than 0.22, depicting the two possible states of a donor atom plus an electron forming a DX complex. In this figure, total energy is plotted against a generalized coordinate which represents the position of the donor as well as neighboring atoms in the lattice. The curve 11 to the left represents the total energy for the usual hydrogenic state of the donor while the curve 12 to the right corresponds to the donor having captured an electron to become negatively charged. This capture results in a new equilibrium position for the donor atom (hence the configuration coordinate shift of the minimum) with a total energy that is lower for certain alloy compositions than that of the normal donor state.

For the $Al_xGa_{1-x}As$ system, the DX state is the ground state when x>0.22 and a reduction of the free carrier concentration by many orders of magnitude from the doping level is often observed as the temperature is lowered and carriers become trapped in the DX centers. No defects are required for this reconfiguration to occur and even high-quality doped material can be rendered non-conducting by this effect. On cooling, the number of negatively charged DX centers grows as the number of positively charged hydrogenic donors shrinks until the two numbers are essentially equal, leaving essentially no carriers in the conduction band.

Persistent photoconductivity occurs when the DX states are ionized by photons of energy equal to, or greater than, $E_{opt}$ (the difference between the minimum value of curve 12 and the energy value of curve 11 at this same coordinate) thus producing shallow donor states with small binding energies of 7–10 meV. These shallow donor states also become ionize(d for temperatures above ~4K and provide free carriers. Thus the photo-conversion of all the DX centers to ionized shallow donors produces a high carrier density. When the ambient temperature is sufficiently low that re-capture of the electrons, which requires thermal excitation over the capture barrier $E_{cap}$ (the difference between the energy minimum of curve 11 and the intersection of curves 11 and 12) does not occur, the carrier concentration remains high indefinitely even after the exciting light source has been removed. Alternatively, if the ambient temperature is maintained at a temperature sufficiently low that such recapture occurs but slowly, the carrier concentration will decrease correspondingly slowly. The value of $E_{cap}$, and hence the maximum operating temperature, depends on the alloy composition. Strongly persistent photocurrent occurs in crystalline $Al_{.27}Ga_{.73}As$ doped with silicon to a concentration of about $10^{19}$ atoms per $cm^3$ below liquid nitrogen temperatures 77 K; higher temperature operation may be possible using DX centers in wide bandgap n-type doped II-VI compounds. Such centers have been observed in ZnCdTe: In, as is discussed in a paper published in Phys. Rev. B40(9) p 6304, Sep. 15, 1989 by Khachaturyan et al. Moreover, PPC has been reported in CdS: Cl at temperatures up to 250° K by E. Harnik.

If the optical fluence (exposure) is a function of position, such as occurs in the formation of a holographic grating, a spatial variation in the extent of ionization occurs. The maximum range of this variation is from unexposed regions, with equal numbers of compensating positive donor ions and negative DX centers, to fully exposed regions containing only positively charged donor atoms and free electrons. The resulting spatial variation in electric field has been demonstrated and used to influence conduction by electrons in a two-dimensional electron gas formed in a heterojunction at a nearby interface with GaAs, as discussed in App. Phys. Lett. 45, 663 (1984) and Physica Scripta T35, 226 (1991).

The present invention is based on the discovery that, in the absence of a heterojunction, the electrons liberated by the ionization of DX centers will remain in the semiconductor region where the DX centers reside and that they are constrained by Coulomb attraction to remain near the positive ions they left behind in order to maintain charge neutrality, until they are subjected to energy in excess of $E_{cap}$, the capture energy which is related to the difference between the minimum of curve 11 and the intersection of curves 11 and 12. This makes possible stable optically-written high resolution conducting features in an insulating background. Moreover, the resulting spatial variation in carrier concentration leads to a strong optical diffraction effect.

To distinguish our invention in which the persistent photoconductivity is created in material in which there is absent a heterojunction, it will be convenient to describe our material as "homogeneous" and the resulting persistent photoconductivity as "volume persistent photoconductivity". As is familiar to workers in the art, a heterojunction is the interface between two regions of materials having different energy bands where a difference in the band gaps of the two regions gives rise to a discontinuity in the conduction band.

Moreover, since the persistence of the photocarriers and the resulting photoconductivity can be controlled by the temperature of the medium, by appropriate choice of the temperature to control the persistence, the spatial variation can be made to self-erase slowly enough for the persistent state to be used and quickly enough to avoid the need for a separate erasing procedure.

Figure 2:
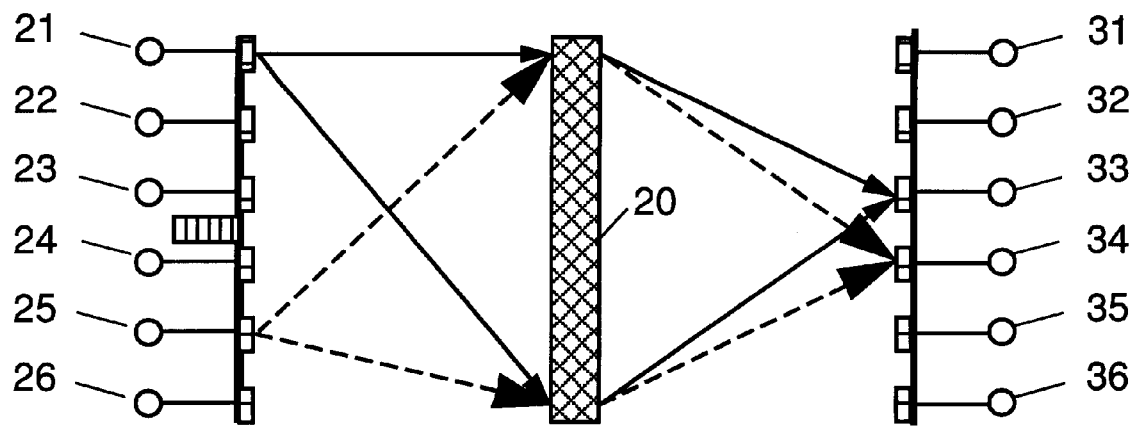
FIG. 2 is an embodiment of the invention in which a volume hologram that was formed using the properties of DX materials is used in an optical interconnect arrangement.
Figure 3:
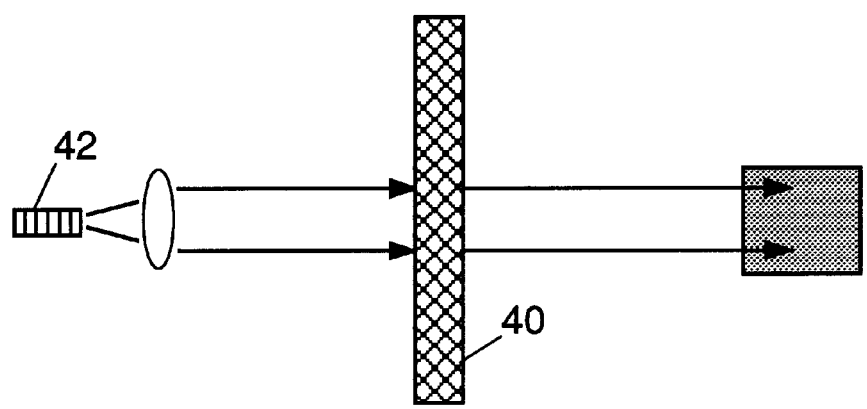
FIG. 3 is an embodiment of the invention in which the properties of DX materials are used to form a holographic memory.

Both the electrical and the optical changes induced by ionization of the DX centers have distinct device potential. The diffractive device possibilities are described with reference to FIGS. 2, 3 and 4.

One arrangement that has been proposed in the past is an optical interconnect system between transmitters and receivers with modulated optical sources transmitting information through a multiple-grating volume hologram which distributes this information selectively to several detectors. Such a system can serve as a replacement for electrical wiring between the output terminal of the translitter and the input terminal of the receiver of the information. It will be convenient to describe such a system as a holographic optical interconnect system. A critical element in such a system is the volume hologram that is used to redirect the modulated optical signals appropriately. An example of such a system is described in Applied Optics, Vol. 26, #18, pp. 3947–3953 by Kostuk et al and reference is made thereto for a more detailed discussion of the principles of such holographic optical interconnect systems. The manner of forming suitable volume holograms is well known in the art and generally involves passing a pair of beams, originating from a common laser source to ensure coherence of the two beams, to intersect and so form a fixed interference pattern in the interior of the medium that is to serve as the volume holograph. The interference of the two beams will cause a corresponding spatial variation of refractive index in the medium so that the medium serves as a refractive grating so that later a monochromatic beam incident on such grating is deflected by an amount related to the spatial frequency of the interference pattern formed in the medium. In the arrangement shown in FIG. 2, a volume hologram that had been earlier formed as spatial variations of refractive index in a medium of DX material 20, such as a crystalline element of AlGaAs, is located intermediate between a linear array of optical sources 21, 22, . . . , 26 and a linear array of photodetectors 31, 32, . . . , 36. A light beam originating at source 21 and pulse modulated in accordance with signal information to be transmitted illuminates the volume hologram and is diffracted in passing therethrough so that it is focused on detector 33. Simultaneously, a light beam originating at source 25 is focused selectively on detector 34. By changing the nature of the volume hologram 20 alternative connections can be obtained.

Another known application of a volume hologram is as a storage medium. In this instance, a number of individual diffraction patterns are stored in the medium by making a number of different pairs of object and reference beams, each pair originating from a coherent source of different wavelengths, interfere, a pair at a time, in the holographic medium, which in the practice of the invention would be a DX medium. Each pair might be used to store a different page of information as the object. Reading of a particular page would be done in the manner illustrated in FIG. 3. The volume hologram stored in the DX medium 40 is irradiated with coherent light from a source 42 of the same wavelength as used to form the particular stored page as is to be retrieved and such light can be used to create a virtual image of the stored page on a screen at an appropriate distance from the volume hologram.

Alternatively, a source of a single wavelength can be used for each page but one changes the angle of incidence of the object beam for each different page to be stored in creating the interfering pattern in the storage medium. Then a virtual image of a selected page could be formed in known fashion by applying to the stored medium a reading beam at an appropriate angle to create an image of the desired beam when the storage medium is viewed along the angle of the object beam used to create the interference pattern. As is known to workers in the holographic arts, it is sometimes necessary to use a longer wavelength for readout than was used for storing to minimize erasing during readout. In this case, it will be advantageous to add a phase correction plate for efficient hologram readout, as described by L. H. Lin in a paper published in Applied Optics 10, p. 1314 (1971).

Additionally, it is feasible to utilize the same AlGaAs useful in the invention to create the familiar type of photorefractive system that does not involve free carriers. Electrons from localized illuminated regions diffuse into adjacent dark regions and are there trapped by the DX defects. The resulting space-(charge between the illuminated and dark regions gives rise to electric fields that modulate locally the index of refraction. This can be done at a temperature high enough that there is no PPC i.e. the photoexcited electrons have enough energy to go over the capture barrier and recombine with ions to generate new DX centers. So this will make the illuminated regions gradually positively-charged and the dark areas gradually negatively charged, with a resulting space-charge layer like the traditional type of photorefractive material. The temperature of operation has to be high enough not to allow PPC but low enough to prevent the ionization of DX centers.

Figure 4:
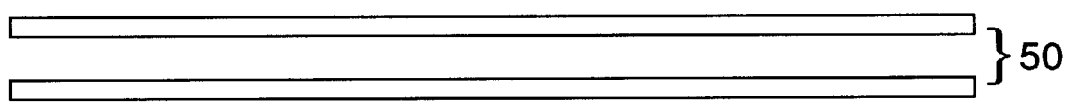
FIG. 4 is an embodiment of the invention in which the properties of DX materials are used to form optically written wave guides.

FIG. 4 shows an optical wave guide 50 that has been formed in a DX medium. In this instance, a light beam is traced to form a pair of parallel stripes of reduced refractive index spaced apart by a distance appropriate for the width of the optical wave guide. The traced stripes of lower refractive indices serve as reflective walls to confine a beam that is introduced at one end of the guide for travel to the other end. Alternatively, in some instances, the desired structure can be obtained by illuminating the DX medium and then forming the desired wave guide by tracing a light beam of intensity sufficient to erase the PPC along parallel tripes appropriately spaced to form the wave guide. As is known, ill such a wave guide, by making the refractive index of the confining stripes lower than that of the material confined, total internal reflection is achieved.

Figure 5:
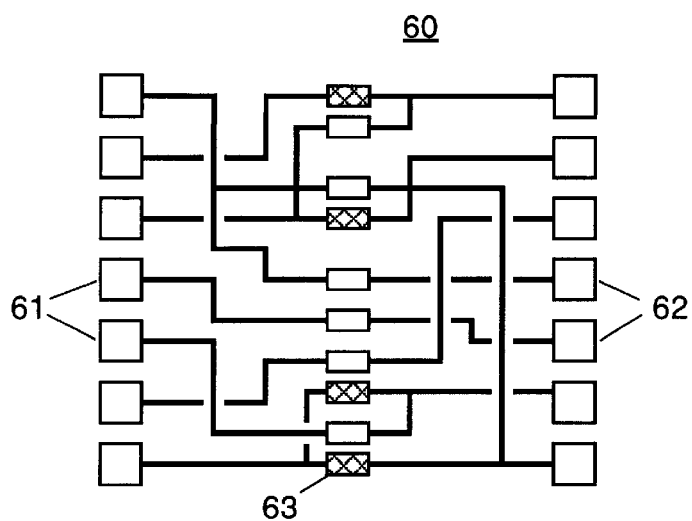
FIGS. 5 and 6 are different embodiments of the invention utilizing the properties of DX materials to provide interconnections selectively.

FIG. 5 shows an embodiment in which a conductive pattern formed at the surface of DX medium 60 is used to form a conductive interconnection network. In this embodiment, the medium may be a doped epilayer exhibiting the PPC effect on an undoped substrate, for example a silicon-doped AlGaAs layer that was grown epitaxially on an undoped GaAs single crystal. Usually it is advantageous to include an undoped buffer layer of AlGaAs between the doped layer and the substrate to prevent formation for electrical isolation As shown, medium 60 is provided at one edge with a first set of conductive leads 61 and at an opposite edge with a second set 62. In this embodiment of the invention, a plurality of localized interrupted conductive paths are formed at the surface by conventional processing techniques incompletely connecting together a lead from the first set with a lead of the second set. In particular, each conductive path includes as an interruption an open section or gap 63 that is normally insulating because the bulk of the medium is normally insulating. To facilitate switching, each of the open gaps is aligned as seen in FIG. 5. An optical beam (not shown) is positioned so that it can sweep across the gaps of the conductive paths. By turning the beam off and on controllably as it sweeps across, selected gaps in the paths can be made conductive by the PPC effect to complete the associated paths.

In the arrangement shown, each input lead can be connected only to a limited number of output leads. To increase the number of interconnections that can be achieved it is feasible to use more intricate patterns of the conductive paths and to include a plurality of gaps in each path, each of which gap is bridged by PPC materials like those described. Moreover, it is possible to use a conventional insulating substrate as the support for the conductive paths limiting the use of the PPC materials to bridge the underlying gaps in the conductive paths. Crossovers in the conductive paths can be achieved in conventional ways, of which many have been developed for use in integrated circuits.

Figure 6:
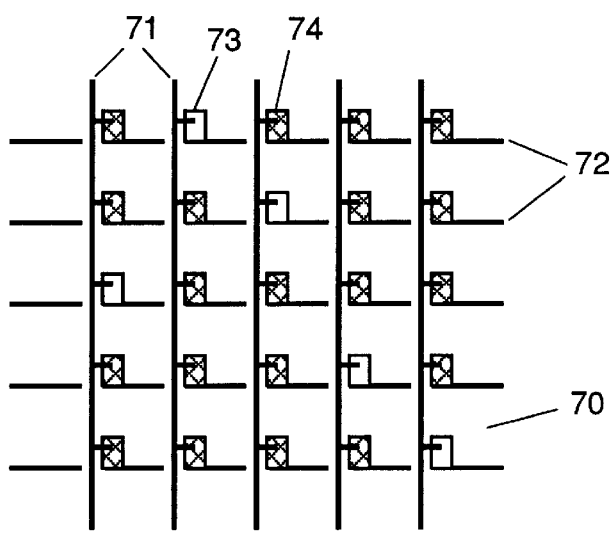

FIG. 6 shows an interconnect network in which crosspoints serve as the gaps. In this instance on the surface of a DX medium there is formed a two dimensional array of crosspoints by depositing a first set of parallel conductive strips 71 by a metallic deposit, for example, all vertical, and a second set of parallel conductive strips 72, all horizontal also by a metallic deposit, with insulation provided at the crosspoints to isolate electrically paths of the first set from paths of the second set. A thin layer of a suitable transparent oxide can be selectively deposited over the intended crossover regions of the first set before deposition of the second set to provide the desired isolation. Thereafter selected crosspoints are shorted together for forming a conductive link such as, at crosspoints 73 bridging the gap between a strip of the first set with a strip of the second set. Such a path will make for a low resistance selectively between a strip of the first set with a strip of the second set which have been shorted together while other pairs of paths will maintain a high resistance between them such as at open crosspoint 74. Light is used to form the shorting conductive links, shown as clear, in the DX medium by making the links conductive in the manner earlier described. In this structure too, it is enough to limit the PPC medium only to the regions that are to serve as the conducting links.

Figure 7:
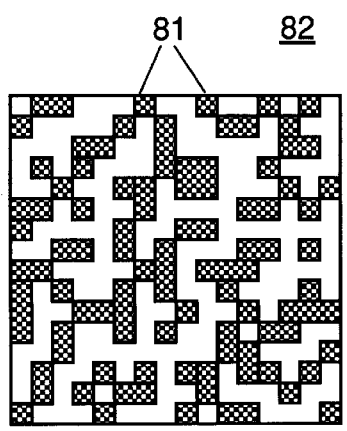
FIG. 7 is an embodiment of the invention in which the PPC properties of DX materials are used to form a memory element.

FIG. 7 shows another embodiment of the invention that can serve as the storage element of a memory. Localized conductive regions 81 are formed at the surface of a DX medium 82 by appropriation optical radiation so that they call serve as localized reflective regions. A near field optical microscope with a point probe sharpened to 30 nanometers can be used to form a desired pattern of coinductive regions in the form of dots with diameters as small as 100 nanometers at the surface. The pattern of conductive regions is made to correspond to a pattern of binary digits to be stored. This pattern later is read by scanning the pattern with a corresponding narrow beam, the conductive dots acting selectively to reflect incident light for collection so that there can be generated a pattern of electrical pulses that correspond to the pattern of conductive dots stored. Because of the persistence of the DX effect, such a memory will serve as a semi-permanent store until the pattern is erased either by heating the medium or by irradiating the surface with sufficiently high intensity light.

Alternatively, the pattern of dots can be read by any one of a variety of other techniques. Such other techniques would include the differential transmission of light through the medium at the regions of dots or the difference of Faraday rotation a scanning light beam would experience in the presence of a magnetic field. Also, the difference is current through a conventional STM (Scaning Tunnelling Microscope) tip.

Moreover, it can be appreciated that there should be a variety of other applications in which the PPC effect described can be used to advantage consistent with the spirit and scope of the invention.

Additionally, as has been pointed out previously, while materials exhibiting the DX effect to provide PPC are presently preferred, there should be other materials exhibiting PPC that can be used similarly.

Additionally, it is feasible to utilize the same AlGaAs useful in the invention to create the familiar type of photorefractive system that does not involve free carriers. Electrons from localized illuminated regions diffuse into adjacent dark regions and are there trapped by the DX defects. The resulting space-charge between the illuminated and dark regions gives rise to electric fields that modulate locally the index of refraction. This can be done at a temperature high enough that there is no PPC i.e. the photoexcited electrons have enough energy to go over the capture barrier and recombine with ions to generate new DX centers. So this will make the illuminated regions gradually positively-charged and the dark areas gradually negatively charged, with a resulting space-charge layer like the traditional type of photorefractive material. The temperature of operation has to be high enough not to allow PPC but low enough to prevent the ionization of DX centers.

What is claimed is:

1. Optoelectronic apparatus comprising:

a storage element comprising a compound semiconductor doped with donors that create DX centers for giving rise to volume persistent photoconductivity;

means for establishing in the storage element a pattern of localized regions of volume persistent conductivity in accordance with information to be stored; and illumination means for optically utilizing the pattern of localized regions of volume persistent photoconductivity.

2. Optoelectronic apparatus in accordance with claim 1, in which the localized regions of the storage element exhibit a change in refractive index, and wherein the illumination means for optically utilizing includes means for providing a beam of light incident on said storage element for being affected selectively by said localized regions.

3. Optoelectronic apparatus in accordance with claim 2, in which the localized regions in the storage element form a volume hologram and the beam of light is patterned by the storage element.

4. Optoelectronic apparatus in accordance with claim 2, in which the localized regions form an optical wave guide for guiding the incident beam of light.

5. Optoelectronic apparatus in accordance with claim 1, in which the localized regions are utilized to affect selectively the reflectivity of light incident on said surface whereby the pattern of the localized regions can serve for the storage of information.

6. Optoelectronic apparatus in accordance with claim 1, in which the compound semiconductor doped with donors is chosen from the group consisting of silicon-doped aluminum gallium arsenide, selenium-doped aluminum gallium arsenide, and doped Group II–Group VI compounds including either selenides or tellurides, and wherein the persistent photoconductivity is the result of the DX centers.

7. Optoelectronic apparatus in accordance with claim 1, in which the compound semiconductor doped with donors is a homogeneous compound semiconductor doped with donors.

8. A process for forming an optical diffraction grating comprising the steps of preparing a homogeneous doped crystalline compound semiconductive element of a material that is capable of volume persistent photoconductivity, and illuminating a surface of the semiconductive element in a fine-line pattern that forms at least one diffractive grating with radiation at a wavelength and at an intensity adequate to establish in the semiconductive element a pattern of localized regions of persistently higher conductivity and lower refractive index than the unilluminated material, which pattern corresponds to the pattern of illumination.

9. The process of claim 8 in which pattern of illumination includes a pair of coherent beams to form a volume hologram in the semiconductive element.

10. The process of claim 8 in which the compound semiconductive element includes DX centers.

11. An optically reconfigurable circuit pattern comprising:

a storage element comprising a homogeneous compound semiconductor doped with donors that create DX centers for giving rise to volume persistent photoconductivity;

pattern-establishing means for optically and selectively establishing a pattern in the storage element of localized regions of volume persistent conductivity; and a plurality of conductive leads electrically coupled to the storage element, whereby the pattern-establishing means selectively establishes any desired predetermined pattern in the storage element, and wherein each pattern is selected so that the relationship between any two conductive leads is either: (a) electrically coupled to each other due to the presence in the patterned storage element of one or more contiguous localized regions of volume persistent photoconductivity, wherein at least one of said one or more contiguous localized regions are electrically coupled to each of the two conductive leads, or (b) electrically insulated from each other due to a lack in the patterned storage element of one or more contiguous localized regions of volume persistent photoconductivity, wherein at least one of said one or more contiguous localized regions are electrically coupled to each of the two conductive leads.

12. The optically reconfigurable circuit pattern of claim 11, in which the localized regions of the storage element exhibit a change in refractive index, and the pattern-establishing means includes means for providing a beam of light incident on said storage element for selectively-affecting the volume persistent photoconductivity of each of said localized regions.

13. The optically reconfigurable circuit pattern of claim 11, wherein the circuit pattern is three-dimensional.

14. The optically reconfigurable circuit pattern of claim 11, wherein the homogeneous compound semiconductor doped with donors is chosen from the group consisting of silicon-doped aluminum gallium arsenide, selenium-doped aluminum gallium arsenide, and doped Group II–Group VI compounds including either selenides or tellurides, and wherein the persistent photoconductivity is the result of the DX centers.

15. Optoelectronic apparatus comprising:

a storage element comprising a compound semiconductor doped with donors that create DX centers for giving rise to volume persistent photoconductivity;

means for establishing in the storage element a pattern of localized regions of volume persistent conductivity in accordance with information to be stored, wherein the localized regions of the storage element exhibit a change in refractive index and form a volume hologram; and means for optically utilizing the pattern of localized regions of volume persistent photoconductivity, including means for providing a beam of light incident on said storage element for being affected selectively by said localized regions, wherein the beam of light is patterned by the storage element.

16. Optoelectronic apparatus comprising:

a storage element comprising a compound semiconductor doped with donors that create DX centers for giving rise to volume persistent photoconductivity;

means for establishing in the storage element a pattern of localized regions of volume persistent conductivity in accordance with information to be stored, wherein the localized regions of the storage element exhibit a change in refractive index; and means for optically utilizing the pattern of localized regions of volume persistent photoconductivity, including means for providing a beam of light incident on said storage element for being affected selectively by said localized regions, wherein the localized regions form an optical wave guide for guiding the incident beam of light.

* * * * *